United States Patent [19]

Shimizu

[11] Patent Number: 5,432,044
[45] Date of Patent: Jul. 11, 1995

[54] METHOD OF FORMING A PATTERN USING A PHASE SHIFTING MASK

[75] Inventor: Hideo Shimizu, Kanagawa, Japan
[73] Assignee: Sony Corporation, Tokyo, Japan
[21] Appl. No.: 133,790
[22] Filed: Oct. 8, 1993

Related U.S. Application Data

[63] Continuation of Ser. No. 918,682, Jul. 27, 1992, abandoned.

[30] Foreign Application Priority Data

Jul. 29, 1991 [JP] Japan .................. 3-211473

[51] Int. Cl.$^6$ .............................. G03C 5/00
[52] U.S. Cl. ......................... 430/269; 430/5; 430/322; 430/394
[58] Field of Search ............ 430/5, 269, 394, 322

[56] References Cited

U.S. PATENT DOCUMENTS 4,118,230 10/1978 Binder .................. 430/394
5,045,417 9/1991 Okamoto .................. 430/5

*Primary Examiner*—Mark A. Chapman
*Attorney, Agent, or Firm*—Hill, Steadman & Simpson

[57] ABSTRACT

A method of forming a pattern using a phase shift mask which comprises applying at least first and second exposures. At least one exposure is conducted by using a phase shifting mask and at least the other exposure is conducted for compensating the amount of light at a phase shifting boundary of the phase shifting mask, the pattern having an inter-pattern distance on a substrate of less than $2.4 \times \lambda / NA$.

The method of the present invention is applicable also to the formation of a pattern to which the existing phase shifting technique can not be applied, as well as to a pattern in which sub-patterns as the phase shifting portions can not be provided, whereby a pattern at a high resolution power can be obtained irrespective of the pattern shape.

5 Claims, 18 Drawing Sheets $l1 = l2 = 0.25 \mu m$ l3 = 0.5 μm
(basic pattern: 0.1μm)

l 4 = 0.35 μm
l 5 = 0.4 μm

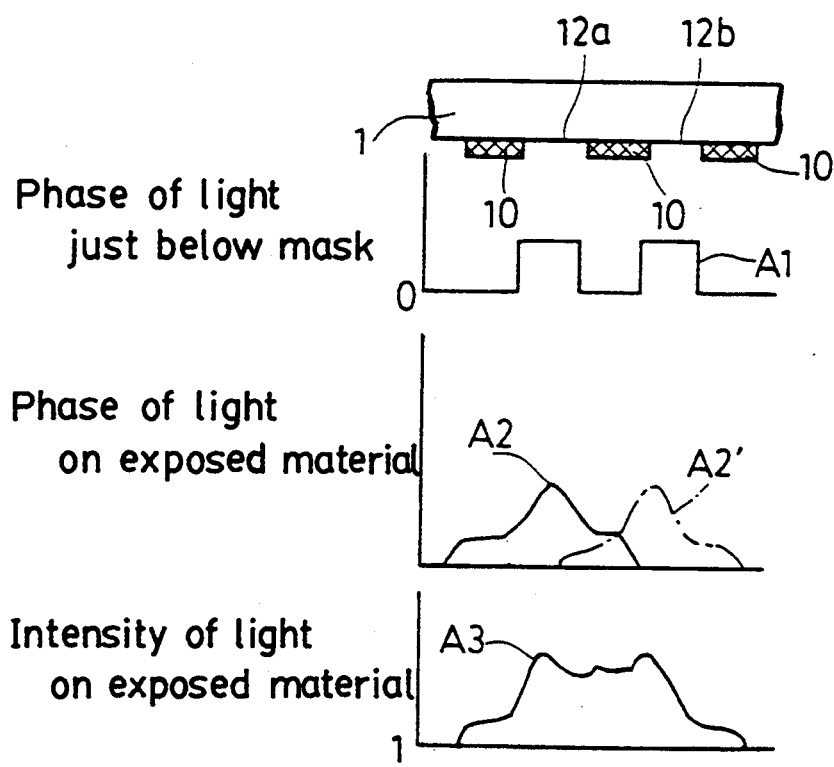

METHOD OF FORMING A PATTERN USING A PHASE SHIFTING MASK

This is a continuation of application Ser. No. 07/918,682, filed Jul. 27, 1992, now abandoned.

BACKGROUND OF THE INVENTION

1. Field of the Invention

The present invention concerns a method of forming a pattern by using a phase shifting mask. The present invention can be utilized as a technique for forming various kinds of patterns and, for example, it can be utilized when forming various kinds of patterns such as a resist pattern in a semiconductor device production process.

2. Description of the Prior Art

The fabrication size of devices to which a pattern is formed by using a photomask, for example, semiconductor devices, has been made finer year by year. With such a situation, in a photolithographic technique for obtaining miniaturized semiconductor devices, a so-called phase shifting technique which provides a phase difference to light permeating a mask, thereby improving the profile of a light intensity, has been highlighted in order to further improve the resolution power of the photolithography.

The phase shifting technology has been described, for example, in Japanese Patent Laid Open Sho 58-173744, "Improving Resolution in Photolithography with a Phase-shifting mask" by Marc D. Levenson, et al., IEEE Transactions on Electron Devices, Vol. ED-29, No. 12, December 1982, P 1828–1836, and "The Phase-shifting Mask II: Imaging Simulations and Submicrometer Resisto Exposures" by Marc D. Levenson, et al., IEEE Transactions on Electron Devices Vol. ED-31, No. 6, June 1984, O 753–753.

Further, Japanese Patent Publication Sho 62-50811 discloses a phase shifting mask having a predetermined pattern comprising permeable portions and impermeable portions, in which a phase member is positioned at least to one of the permeable portions on both sides of an impermeable portion, and a phase difference is caused between the permeable portions on both sides thereof.

A description will now be given of the phase shifting technology known so far with reference to FIGS. 18a, 18b below.

For example, in a case of forming a line-and-space pattern, in a usual existing mask a light shielding portion 10 is formed using a light shielding material such as Cr (chromium) or other metal or metal oxide on a transparent substrate 1 made of a quartz substrate or the like as shown in FIG. 18(a) by which a repeating line-and-space pattern is Formed as an exposure mask. Theoretically, in the intensity distribution of light transmitting the exposure mask, the light intensity is 0 at the light shielding portion 10, while light transmits at other portions (permeable portions 12a, 12b) as shown by reference A1 in FIG. 18(a). Considering then one permeable portion 12a, the transmission light incident on an exposed material has a light intensity distribution by diffraction of light or the like having hill-like extremes at the skirts on both sides as shown at A2 in FIG. 18(a). The transmission light A2′ from the permeable portion 12b is indicated by a dotted line. When light from each of the permeable portions 12a, 12b is synthesized, the light intensity distribution loses its sharpness and the image becomes blurred due to light diffraction as shown at A3. As a result, sharp exposure can no more be attained. On the contrary, if a phase shifting portion 11a (made of material such as SiO₂ or resist, referred to as a shifter) is disposed on every other light permeable portion 12a, 12b of the repeating pattern as shown in FIG. 18(b), a blur of the image caused by the light diffraction is offset by the inversion of the phase. Accordingly a sharp image is transferred to improve the resolution power and the focus margin. That is, as shown in FIG. 18(b), in a case where a phase shifting portion 11a is formed at the permeable portion 12a on one side as shown in FIG. 18(b), and, if it provides a 180° phase shift, for example, the light passing through the phase shifting portion 11a is inverted as shown by reference B1. The light from the adjacent permeable portion 12b causes no such inversion since it does not pass the phase shifting portion 11a. Portions of light distributions are inverted to each other in phase and are offset with respect to each other at a position shown by B2 in the figure at the skirts of the light intensity distribution, and, the distribution of light on the exposed material have sharp identical shape as shown at B3 in FIG. 18(b).

In the above-mentioned case, for making the effect most reliable, it is most advantageous to invert the phase by 180° and, for this purpose, a phase shifting portion 11a has a film having a film thickness D:

$$D = \frac{\lambda}{2(n-1)}$$

in which n represents a refractive index of the phase shifting portion and k represents a wavelength for exposure light.

In the pattern formation by exposure, means used therefor are sometimes referred to, for example, as a reticle when it is used for diminishing projection, as a mask for 1:1 projection, as a reticle when it corresponds to an original, or as a mask when it is reproduced from the original. In the present invention, masks or reticles in such various meanings are collectively referred to as a mask.

The phase shifting mask described above for shifting the phase of light between adjacent light permeable portions (ideally 180° inversion) is referred to as a space frequency modulation type (or Levenson type), and which has the greatest effect for improving the resolution power among other several kinds of phase shifting mask methods (referred to as an edge emphasis type, light screening effect emphasis type or the like)(refer to "Nikkei Micro-device", July 1990, P 108–114, Nikkei MacGrow Hill Co.).

The phase shifting mask of this type is a highly prospective technique for improving the resolution power, and it is necessary to provide, desirably, a 180° phase difference between transmission lights in adjacent patterns as described above. However, portions with the phase difference of 0° to 180° can not be satisfactorily arranged adjacent to each other depending on the pattern and, accordingly, applicable patterns have been restricted.

For instance in a case where there are first and second patterns P1 and P2 adjacent to each other, and further there is present a third pattern P3 adjacent with both of the patterns P1 and P2, 0° and 180° can not be basically allocated. If 0° and 180° are allocated to the first and the second patterns P1 and P2 adjacent to each other, the phase shifting effect can not be provided to either one of the first and the second patterns P1 and P2 in or none of the case of allocating 0° or 180©to the third pattern P3 adjacent to both of the patterns P1 and P2.

Further, there is also a technique of attaching a sub-pattern at the periphery of a contact hole or an isolated line, and providing the sub-pattern with a phase difference of 180° to improve the resolution power. For instance, as shown in FIG. 11, four sub-patterns 11 are formed around a pattern 12 for forming a contact hole, and the sub-patterns are used as the 180° inversion phase shifting portion. However, such a technique also has a drawback that sub-patterns as the phase shifting portion can not be arranged if the patterns are excessively close to each other.

SUMMARY OF THE INVENTION

An object of the present invention is to overcome the foregoing problems in the prior art and provide a method of forming a pattern by using a phase shift mask, applicable also to a pattern to which a phase shifting technique can not be applied thus far, and applicable to a pattern in which sub-patterns as the phase shifting portion can not be disposed, and which is capable of obtaining a high resolution pattern irrespective of the shape of a pattern.

SUMMARY OF THE INVENTION

The foregoing object is attained in accordance with the first aspect of the present invention by a method of forming a pattern using a phase shifting mask which comprises applying at least first and second exposures wherein at least one exposure is conducted by using a phase shifting mask and at least the other exposure is conducted for compensating the amount of light at a phase shifting boundary of the phase shift mask.

The foregoing object is attained in accordance with the second aspect of the present invention by an exposure method of forming a pattern with an inter-pattern distance on a substrate of less than $2.4 \times \lambda/NA$ ($\lambda$: wavelength of the exposure light and NA: aperture number after exposure) by using a phase shifting mask, wherein at least, first and second exposures are applied in which at least one exposure is conducted by using a phase shifting mask.

In a second aspect of the present invention, at least first and second exposure can be done preferably by using masks of an identical (or substantially identical) shape. In any of the first and the second aspects, it will be apparent that at least first and second exposures may be applied by using masks different from each other and, for example, it may be a combination of exposure with a phase shifting mask and exposure of a usual mask.

In a first aspect of the present invention, not only the exposure using the phase shifting mask, but also the exposure for the compensation of the amount of light at the phase shift boundary of the phase shifting mask, are employed. Accordingly, also for a pattern in which phase inversion portions can not alternately be allocated satisfactorily between adjacent patterns, the pattern is divided, for example, 0° and 180° phase in which the indefinite portion for the amount of light caused at the boundary between 0° and 180° can be compensated by exposure in this case and, accordingly, a pattern with a good resolution power can be obtained as a whole. Also, for a fine pattern For which sub patterns can not be formed so far, the phase shifting technique is applicable in the same manner by the compensation for the amount of light.

In the second aspect of the present invention, it is possible to form a pattern by a phase shifting technique of high resolution power also by a double exposure. The second aspect of the present invention has been achieved based on the finding as described below.

It is assumed two sub-shifters (sub-patterns formed of the phase shifting portion here and hereinafter) 11a and 11b are disposed between two hole patterns 12a and 12b as shown in FIG. 12(a). In this case, if both of the sub-shifters 11a and 11b are excessively close to each other, another hole pattern is formed at the center as shown by reference C in FIG. 13. Then, it is necessary to separate them to such a distance as will give no effect, as indicated by reference D in FIG. 14.

FIG. 15 is a graph illustrating the distance and the light intensity at the center between the sub-shifters 11a and 11b. Assuming the light intensity as 0.3, $Z=0.2$ um. If it is standardized with $\lambda/NA$, it is about $0.35 \times \lambda/NA$.

Accordingly, the distance in the hole is $(0.85 \times \lambda/NA) \times 2 + 2.35 \times \lambda/NA + 0.35 \times \lambda/NA = 2.4 \times \lambda/NA$ at the maximum.

On the other hand, assume the case as shown in FIG. 12(b) in which only one sub-shifter 11c is disposed between two hole patterns 12a and 12b and used in common. For a hole pattern of 0.35 um × 0.30 um, a graph was prepared indicating the distance between the pattern center and the shifter center on the abscissa and the light intensity at the center and the edge on the ordinate (FIGS. 16, 17).

In view of the graph, an optimum contrast can be attained at a distance x of about 0.45 um. This is a case of NA=0.42 in KrF laser exposure and if it is standardized by $\lambda/NA$, it is applicable also to i-rays or g-rays. That is, the optimum contrast is attained at 0.5–0.85 times $\lambda/NA$.

Accordingly, for a pattern with the distance between two holes of less than 1:3 $\lambda/NA$, it is necessary for a double exposure while using two masks divisionally.

From the foregoing, it can be seen that exposure is effective for the distance of less than $2.4 \times \lambda/NA$ in any of the cases, by which a good pattern formation is possible.

DETAILED DESCRIPTION OF THE PREFERRED EMBODIMENTS

A description will now be made of preferred embodiments of the present invention but it will be apparent that the invention is not restricted to the following embodiments.

EXAMPLE 1

Figure 1:
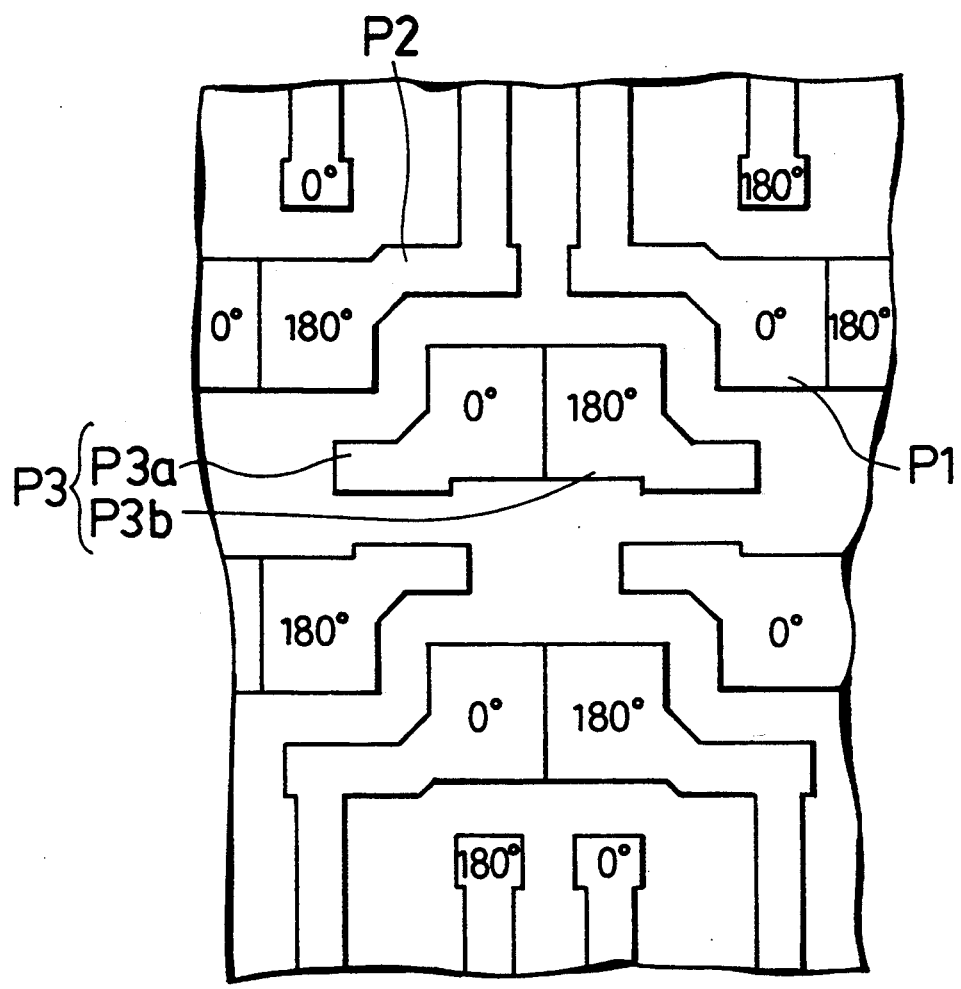
FIG. 1 is a plan view illustrating the construction of a phase shifting mask used in Example 1.
Figure 2:
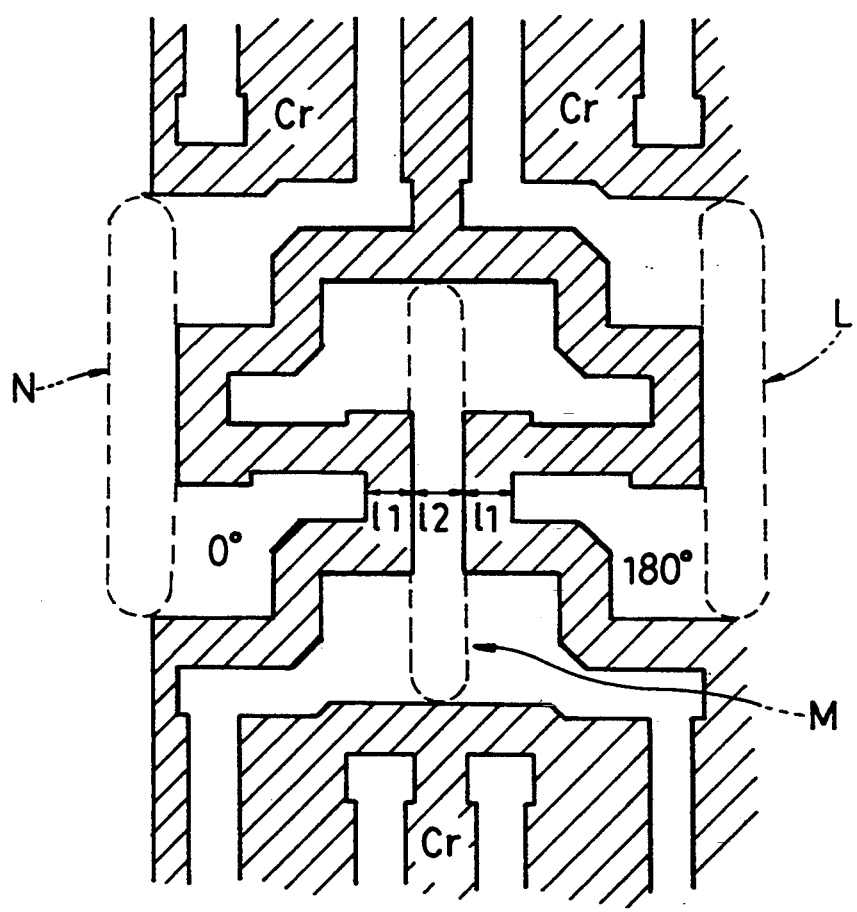
FIG. 2 is a view illustrating a pattern to be formed in Example 1 (an example of a LOCOS pattern of SRAM)
Figure 3:
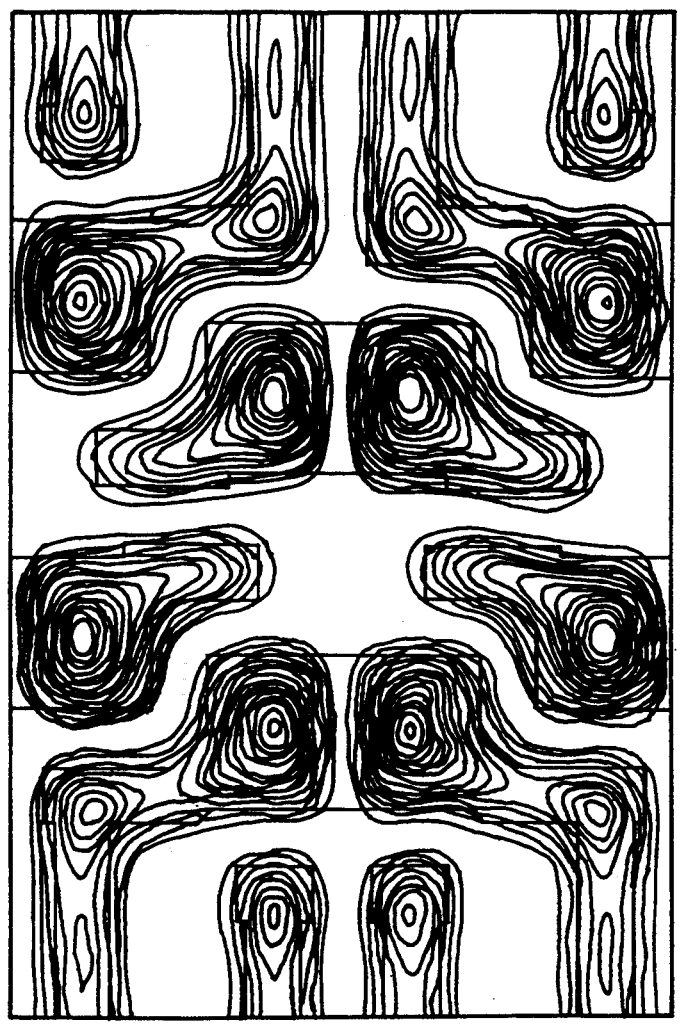
FIG. 3 is a view showing the simulation of a light intensity distribution of the mask shown in FIG. 1.
Figure 5:
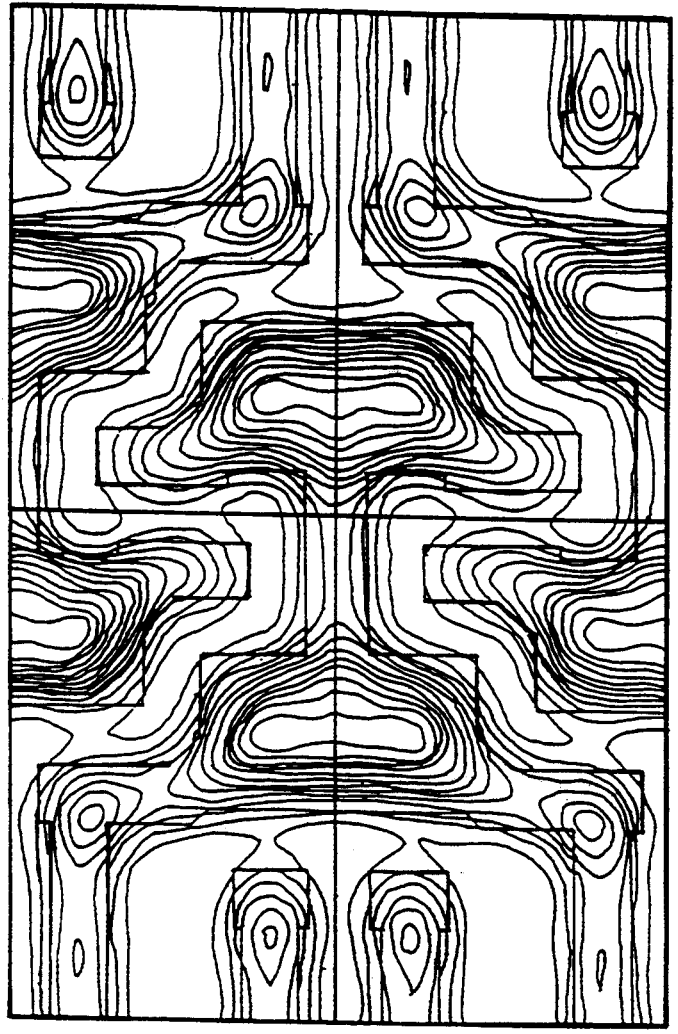
FIG. 5 is a view showing the simulation of a light intensity distribution in a usual exposure method as a comparison to Example 1.

In this example, the method of forming the pattern accordance with the first aspect of the present invention is applied to a formation of a LOCOS pattern of a refined and integrated semiconductor device, in particular SRAM. FIG. 1 shows a phase shifting mask used in this example, and FIG. 2 shows an example of a structure of a LOCOS pattern of SRAM formed therewith. The minimum line width of the LOCOS pattern is 0.25 um, which is assumed for a 64 Mbit SRAM. Such a fine pattern is difficult to be dissolved even by exposure with a KrF excimer laser stepper having the highest resolution power among existent steppers (projection exposure machines). That is, FIG. 5 shows a result of simulation for the light intensity distribution in a case of exposure with a KrF laser beam (248 nm), assuming N.A. as 0.42, by using a usual exposure technique. As shown in the figure, light turns around also into light screening portions by diffraction. In this pattern, however, since at least three patterns are adjacent with each other, it can be divided such that 0° and 180° are adjacent to each other.

Figure 8:
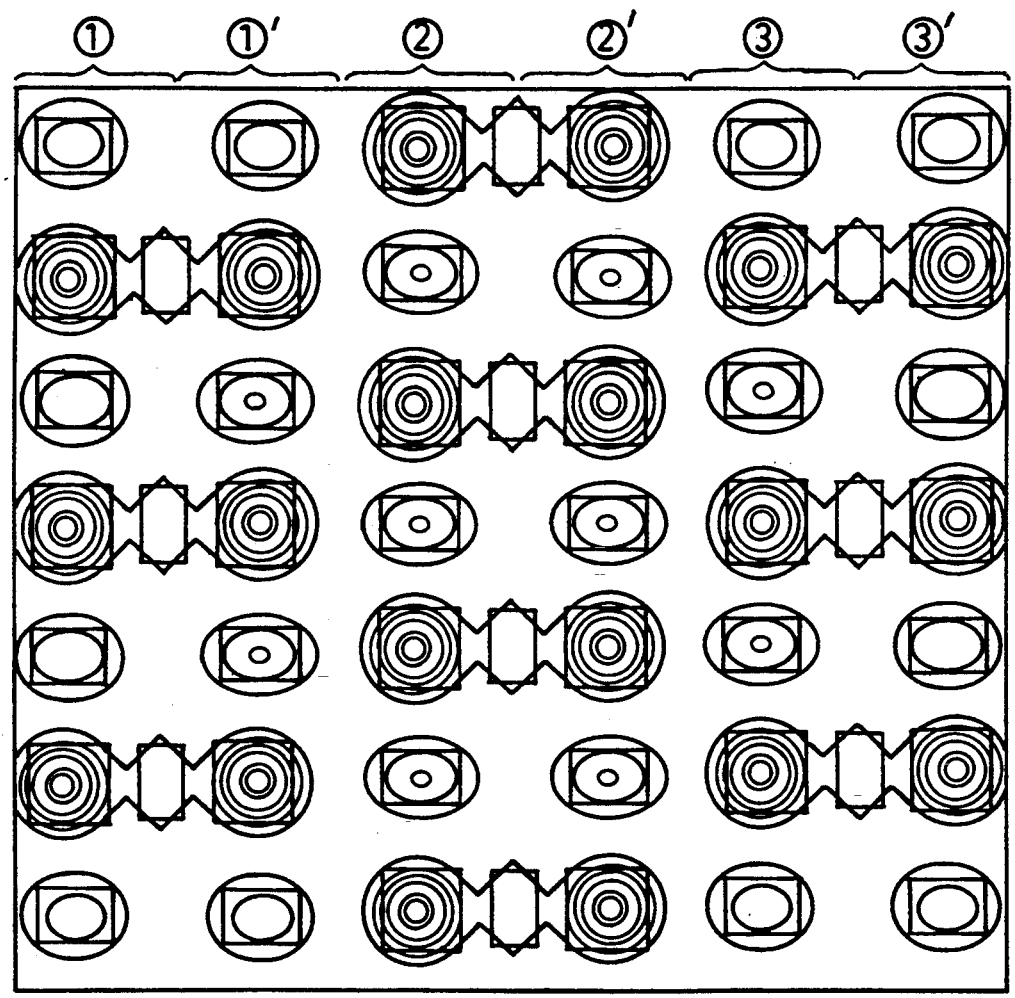
FIG. 8 is a view showing the simulation of a light intensity for the pattern in FIG. 7.

On the contrary, in the phase shifting mask used in this example, one of the patterns is divided at the central portion and a 180° shifter is formed for one of the patterns as shown in FIG. 1. That is, for the patterns P1, and P2, and the pattern P3 adjacent to both of them, the patterns P1 and P2 are divided into 0° and 180° to provide a phase shifting effect with respect to each other and, at the same time, the pattern P8 is divided into a 0° and 180° portion (each portion represented by P3a and P3b). However, since the fine pattern portion is not resolved, the portion is excluded. When exposure is applied by using the mask, a light intensity distribution as shown in FIG. 8 is obtained. For the pattern P3, the light intensity is reduced to 0 at the boundary between 0° and 180°. Further, the excluded portion, because of the fineness of the pattern, is not dissolved. However, other portions are dissolved sufficiently.

A first exposure is applied by using the mask described above. When it is utilized for the formation of a resist pattern, it is preferred to use, for example, XP-8843 which is a negative type chemically sensitized resist manufactured by a the Shipley Co., and which is sensitive to a KRF excimer laser beam and capable of resolving a 0.25 um pattern.

Figure 4:
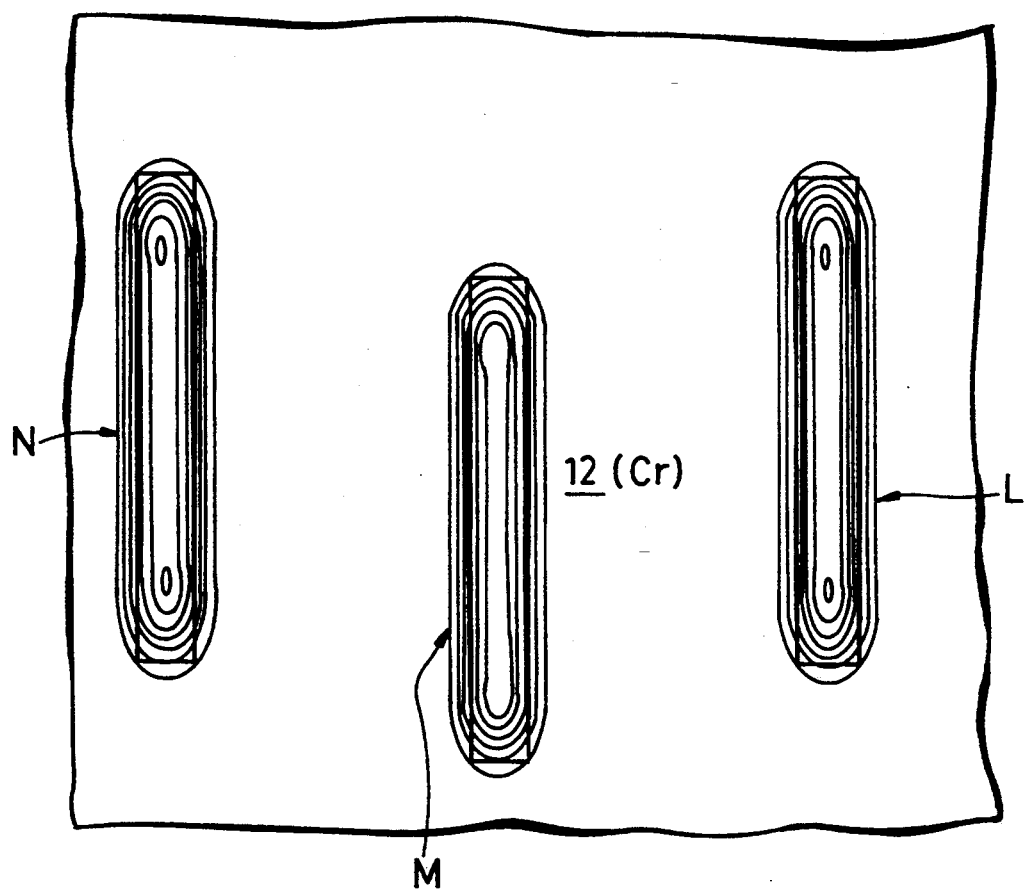
FIG. 4 is a view showing the simulation of a light intensity of a second mask used for second exposure in Example 1.

After applying the first exposure as described above, a second exposure is applied as it is with no development. The mask used for the second exposure is such as is capable of compensating exposure at least for the amount of light at the phase shifting boundary of the phase shifting mask in FIG. 1. That is, a mask is used which is formed so as to irradiate light only to the boundary portion between 0° and 180° which was not irradiated by with the first exposure, as well as the excluded portion because of the fineness of the pattern as required. In this case, a mask showing the distribution of the light intensity in FIG. 4 was used. A portion M in FIG. 2 is exposed and resolved by a portion M in FIG. 4. This corresponds to a portion of insufficient amount of light at the boundary between 0° and 180° of the pattern P3 in FIG. 1. In the same way, the portions N, L in FIG. 4 correspond to the portions N, L in FIG. 2. The line width is 0.25 um as shown at 11, 12 in FIG. 2. Since this is an isolated pattern, sufficient exposure is possible by a usual exposure mask in the second exposure. However, also for the second mask used for the second exposure, sub-patterns may be formed on both sides and the phase shifting method may be applied. In this example, the pattern is bisected, two kinds of masks are prepared and a double exposure is applied, so that the phase shifting method is applicable irrespective of the pattern shape, and even a fine pattern can be formed.

According to this example, a good resolution was attained for a pattern, which can not be resolved by a single exposure, by dividing the pattern into two (or more) portions, preparing two masks, and applying an exposure several times in which the phase shifting method is applied at least to one of them.

In this example (and also in subsequent examples), it will be apparent an accurate positioning alignment is necessary for the first and second exposure. There are no particular restrictions on the structure and the fabrication method of the phase shifting mask. For instance, it can be adopted as a general method of depositing a transparent electroconductive film (ITO or the like which is effective for the reduction of charge up upon EB drawing) of Cr in the following order on a quartz substrate, forming at first a CR pattern, then coating SOG and resist successively thereover and forming a shift pattern by EB drawing.

EXAMPLE 2

Figure 11:
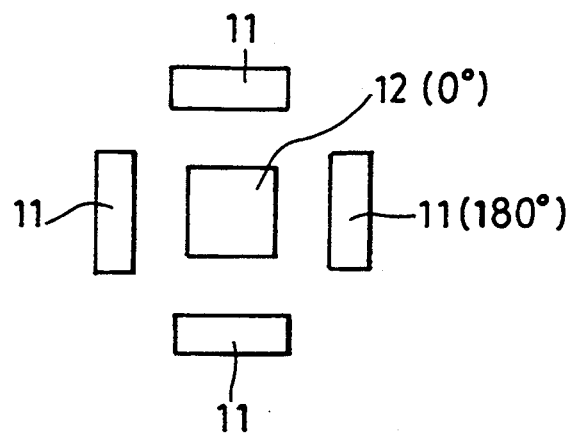
FIG. 11 is an existing structural example of a phase shifting mask.
Figure 12A:
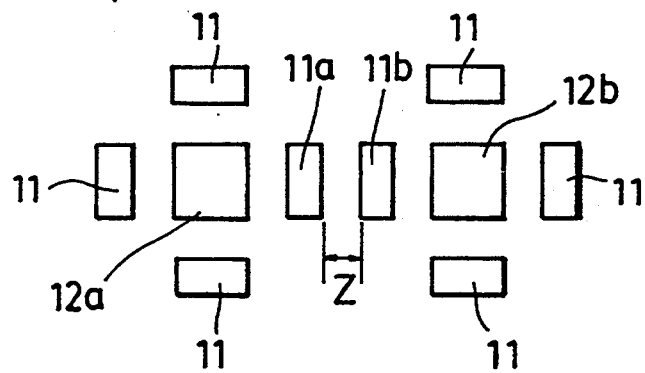
FIG. 12 is an existing structural example of a phase shifting mask.
Figure 12B:
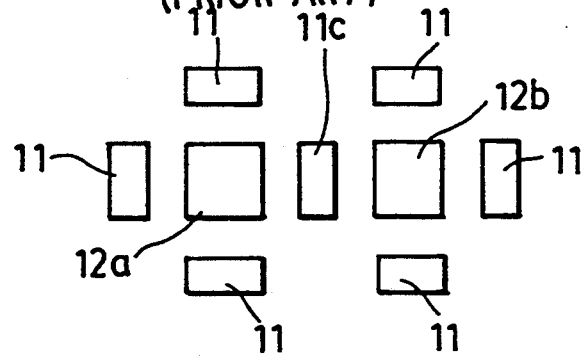
Figure 13:
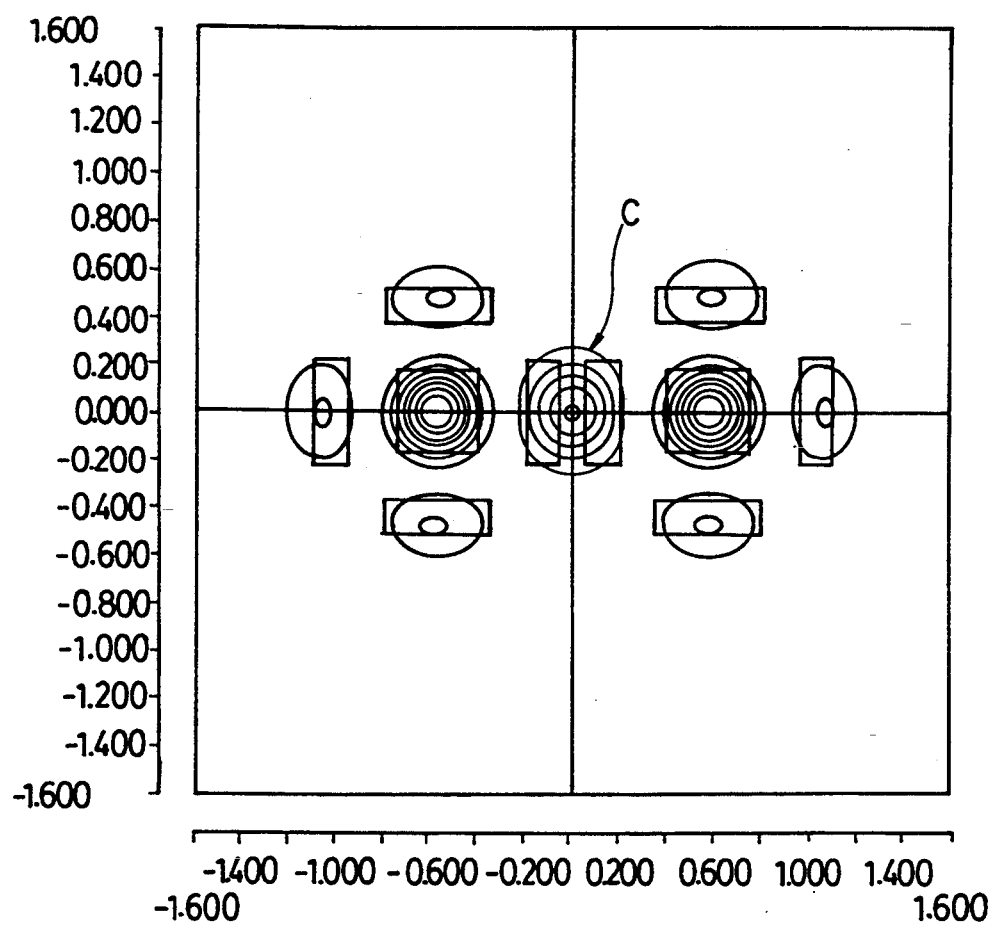
FIG. 13 is a view showing the simulation of a light intensity distribution for explaining problems.
Figure 14:
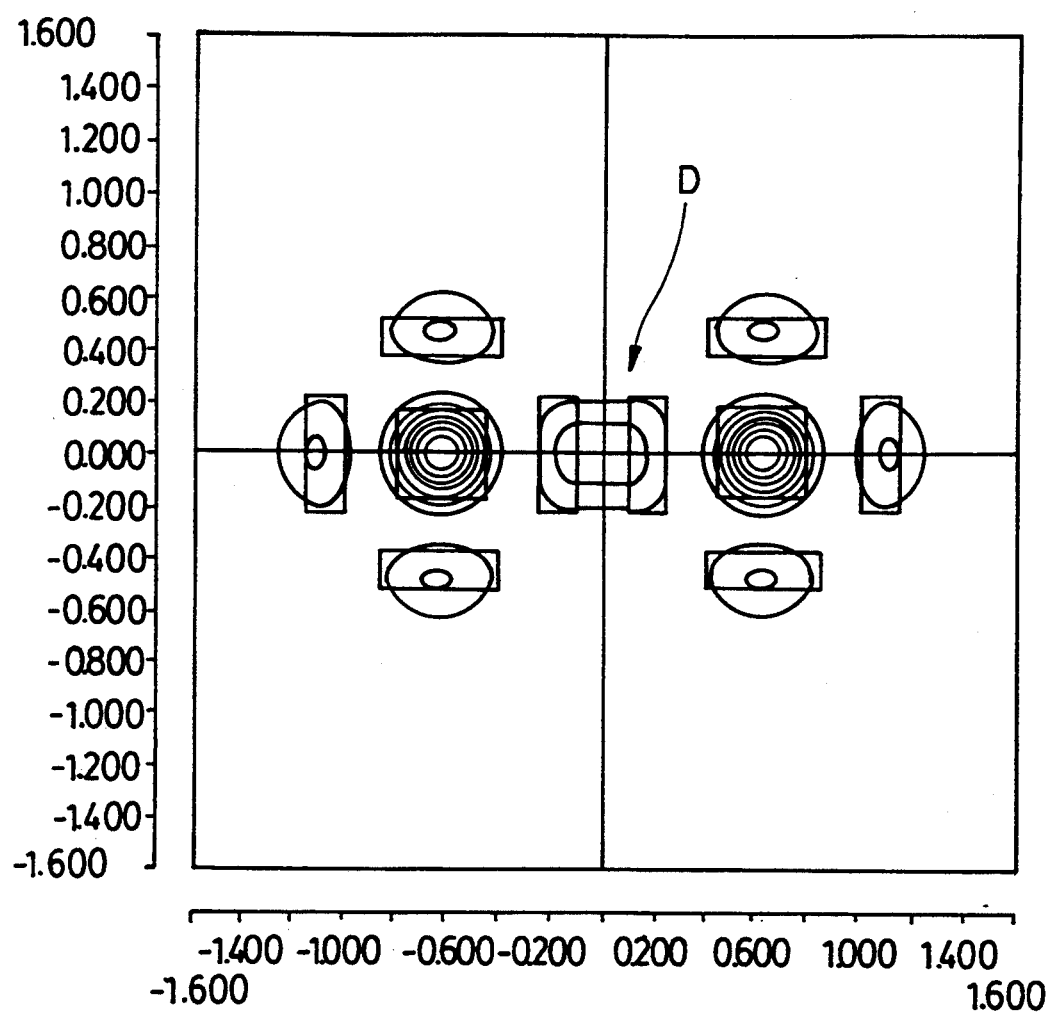
FIG. 14 is a view showing the simulation of a light intensity distribution for explaining certain problems of the existing structures.
Figure 15:
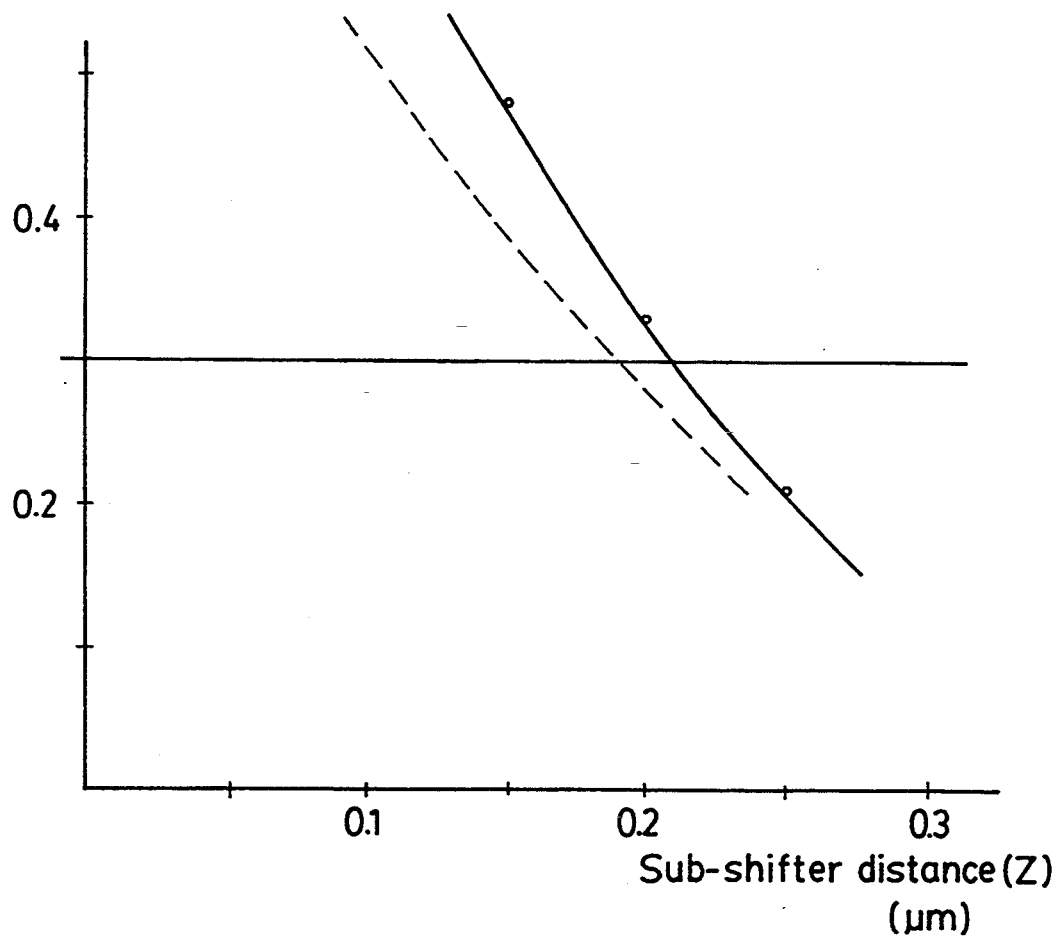
FIG. 15 is a view showing explaining a problem of the existing structures.
Figure 16:
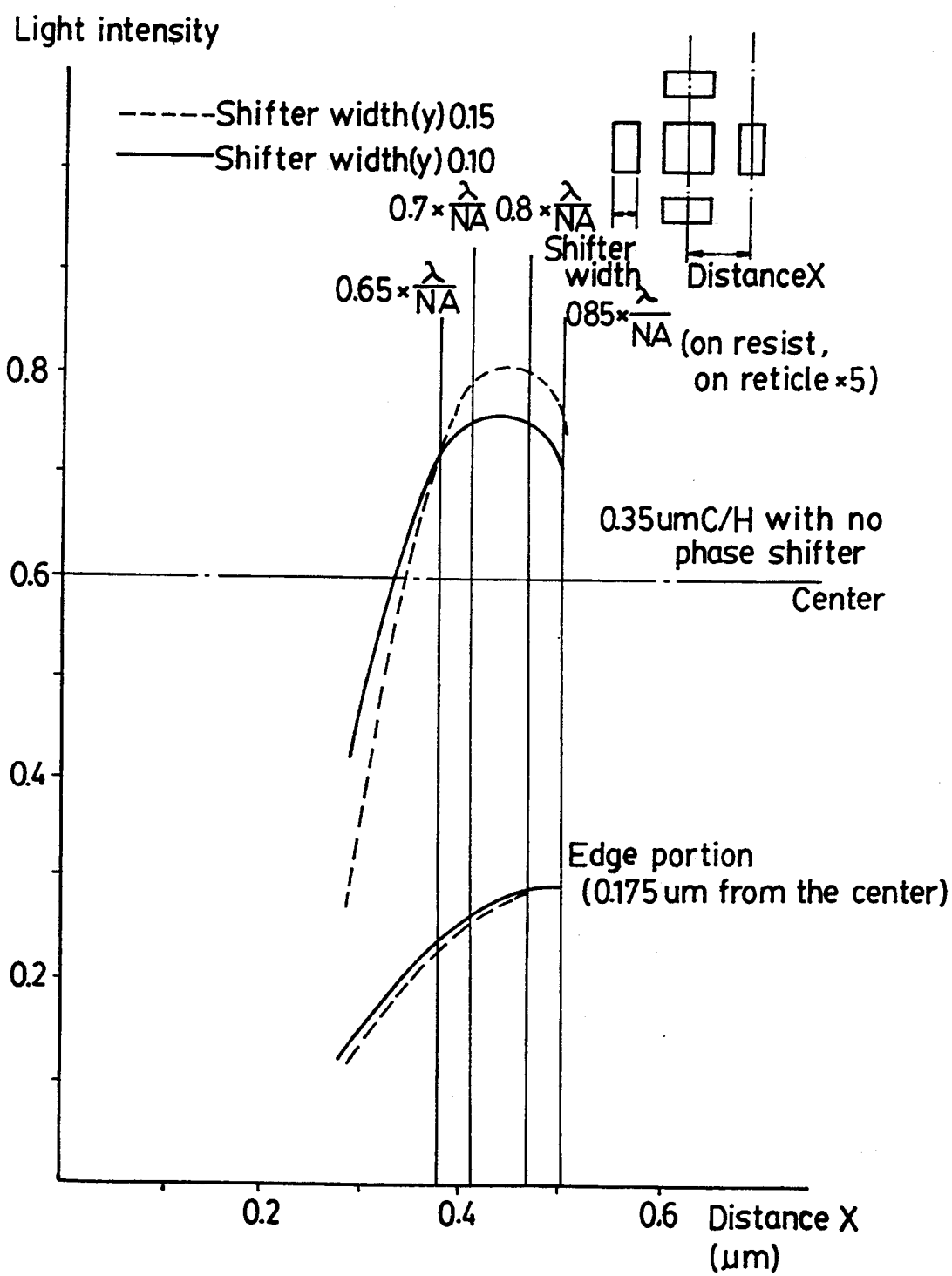
FIG. 16 is a view showing explaining a problem of the existing structures.
Figure 17:
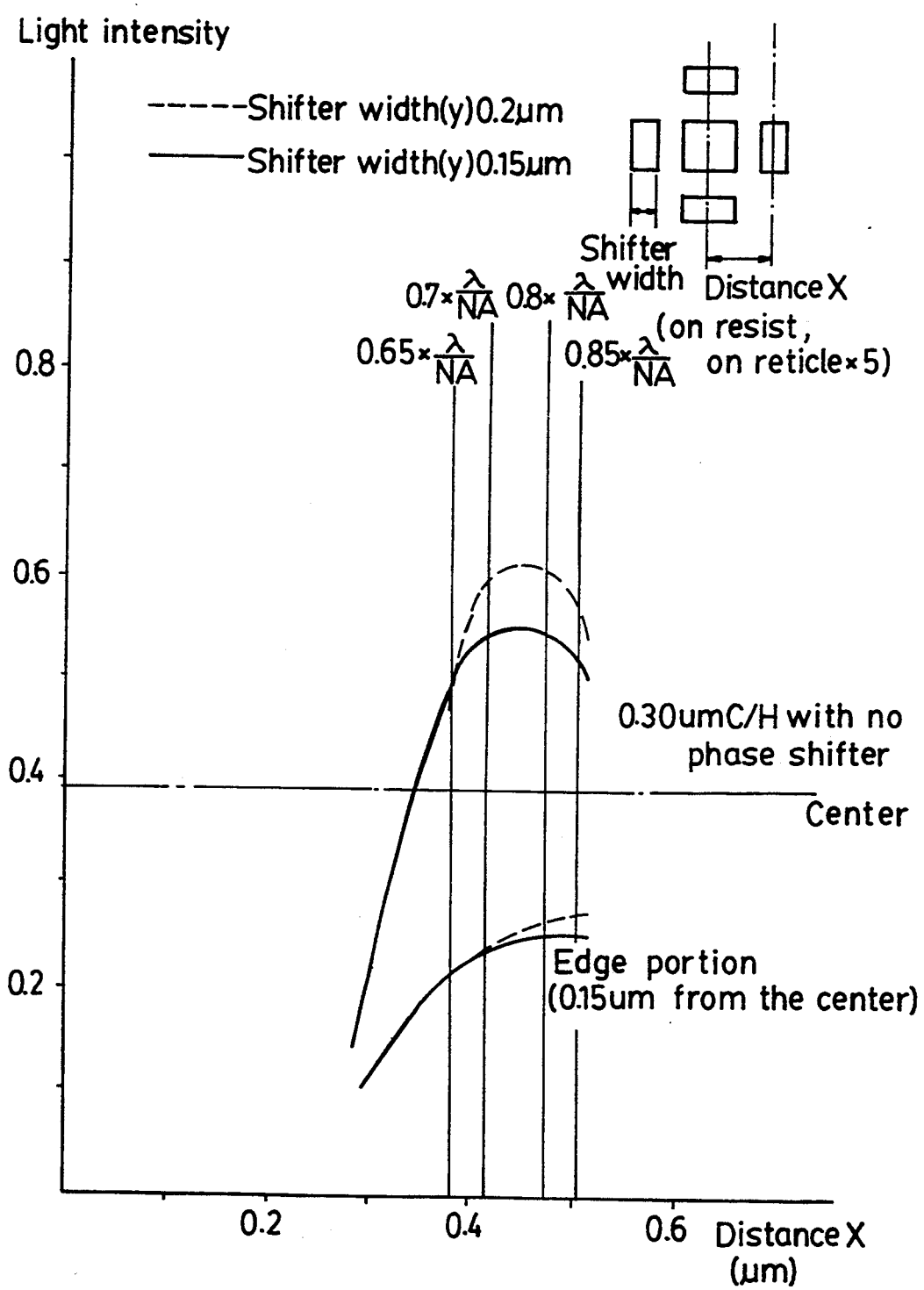
FIG. 17 is a view showing explaining a problem of the existing structures.
Figure 18B:
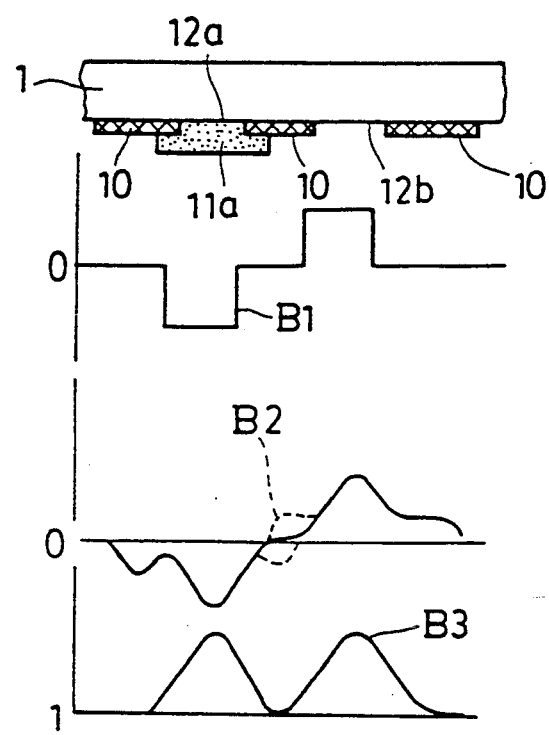
FIG. 18 is an explanatory view showing the principle of the prior art phase shifting mask.

In this example, the second aspect of the present invention was applied to the exposure for forming a contact hole pattern. Application of the phase shifting method to the contact hole pattern is possible by attaching the sub-shifters as shown in FIG. 11. However, in actual device patterns, holes are often close to each other, thus sometimes making it impossible for the application.

Figure 7:
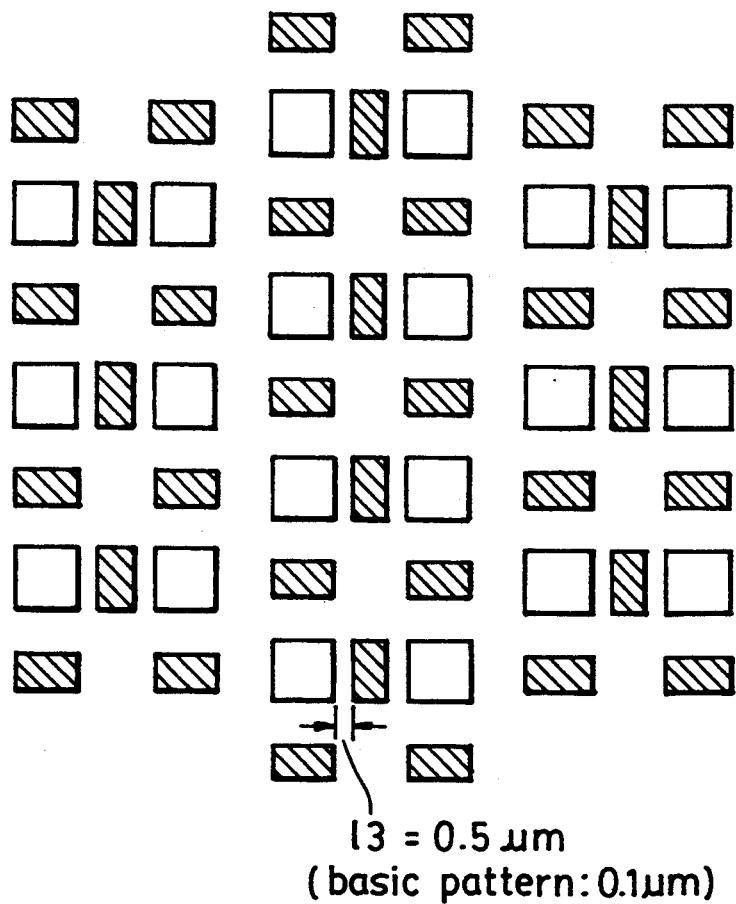
FIG. 7 is a view illustrating an example of preparing sub-shifters by a conventional phase shifting method as a comparison in Example 2.
Figure 9:
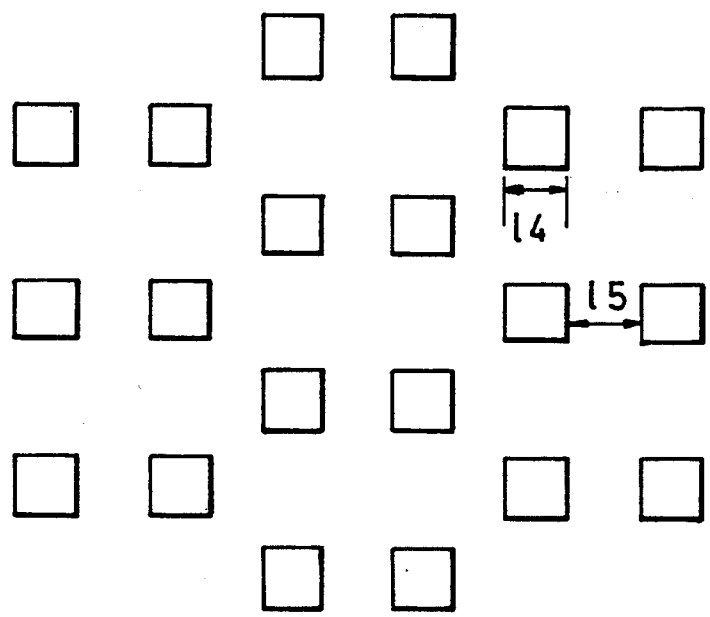
FIG. 9 is a view for a contact hole pattern on a substrate to be formed in Example 2.
Figure 10:
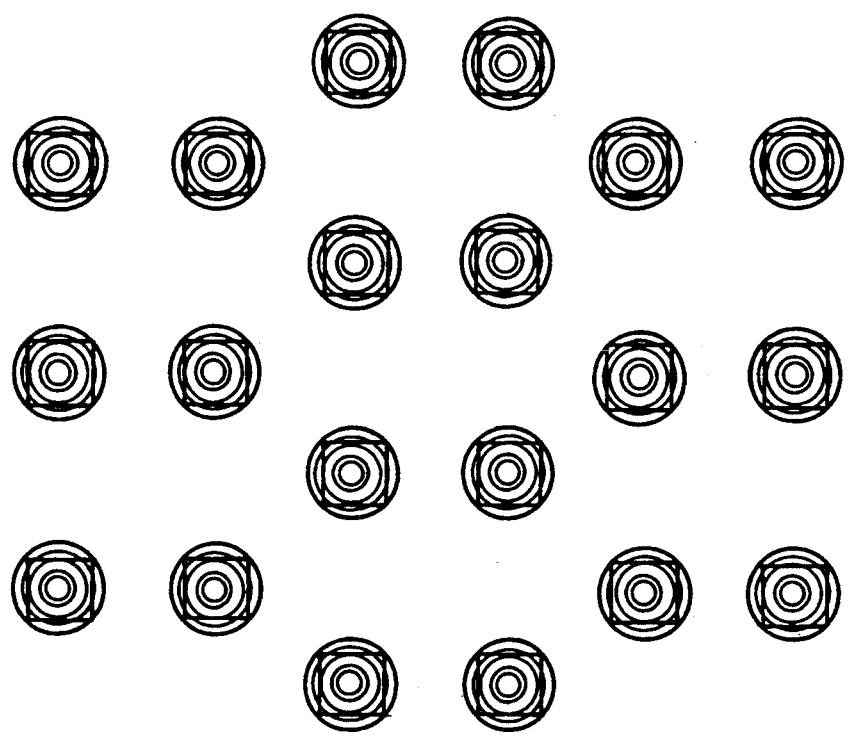
FIG. 10 is a view for the simulation of a light intensity distribution by a conventional exposure method as a comparison in Example 2.

For instance, assuming a 64–256 Mbit DRAM, a hole pattern as shown in FIG. 9 is necessary. This is a fine pattern with an 0.35 um square on a substrate. The pattern is also difficult to be dissolved with a KrF excimer laser beam since the contrast is insufficient. In the exposure by a conventional method, only the intensity distribution shown in FIG. 10 is obtained. Then, if sub-shifters dare to be formed, they are shown in FIG. 7. In the figure since there are so many patterns, the light shielding portions (Cr or the like), that is the sub-shifters (180°), are shown by hatched lines. If the sub-shifters are intended to be positioned for such a fine contact hole pattern, there are still portions which can not be positioned. If exposure is applied by using such a mask, a distorted intensity distribution is caused, as shown in FIG. 8. Furthermore, since some of the sub-patterns in FIG. 7 are excessively close to the main patterns (0.1 um on the wafer and 0.5 um on the mask), an accurate drawing is no longer possible due to the proximate effect of EB upon manufacture of the mask.

Figure 6:
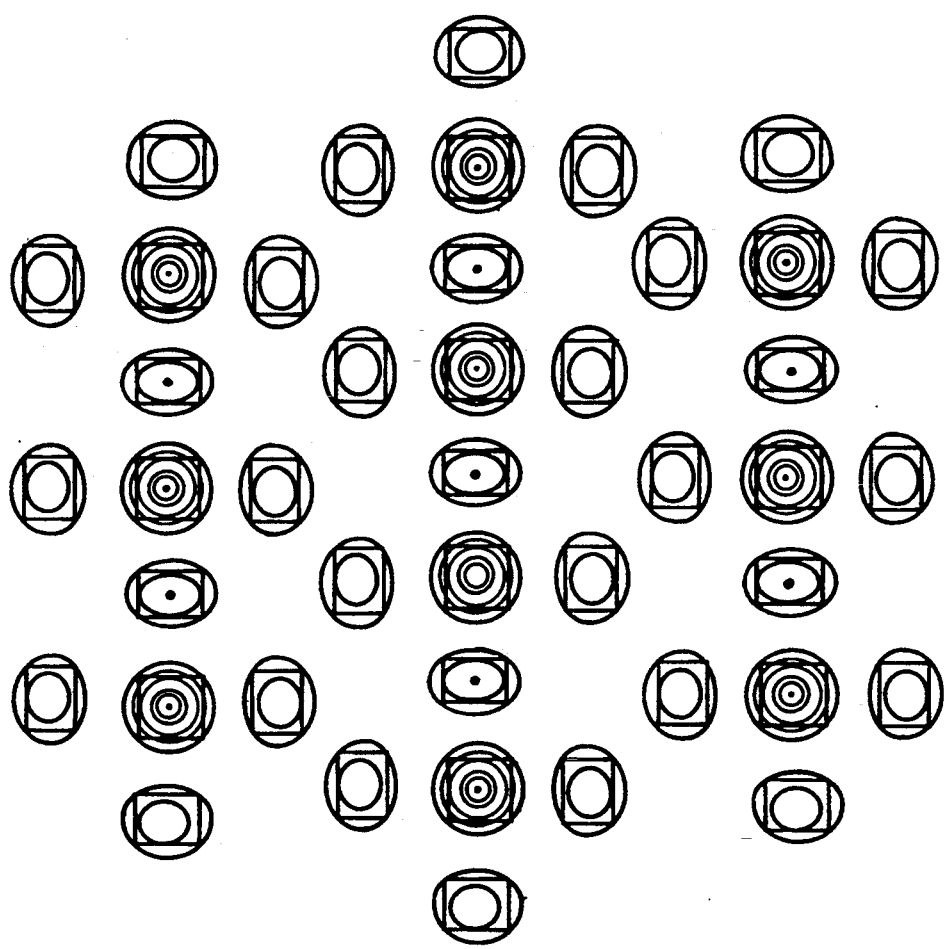
FIG. 6 is a view showing the simulation of the light intensity in the mask of Example 2.

Then, in this example, an exposure mask as shown in FIG. 6 is used. In this example, the pattern is bisected in which two identical masks having the arrangement of the pattern shape (including the shifter pattern in FIG. 6 are prepared and exposure is conducted twice by using them, thereby applying the phase shift method in the same way to all of the hole patterns. That is, patterns (1), (2) and (8) in FIG. 8 are selected for the mask shown in FIG. 6 and a first exposure was applied by using it. Then, by exposing patterns (1)', (2)' and (8)' in FIG. 8, by using the mask identical therewith (using in a deviated state), the same exposure as in FIG. 8 can be attained as a whole at a good resolution power and also with a phase shifting effect. Since a positive resist is required in the actual exposure, FH-EX (Fuji Photographic Film Ink) may be used preferably as a resist capable of resolving a 0.35 um pattern.

As has been described above, the method of forming the pattern according to the present invention is applicable to the formation of a pattern for which a phase shifting technique could not be applied in the prior art, and it is applicable also to a pattern in which sub-patterns as the phase shifting portions can not be provided and, accordingly, it can provide an effect capable of obtaining a pattern at a high resolution irrespective of the pattern shape.

Although various minor changes and modifications might be proposed by those skilled in the art, it will be understood that I wish to include within the claims of the patent warranted hereon all such changes and modifications as reasonably come within my contribution to the art.

What is claimed is:

1. A method of forming a pattern, comprising the steps of:
   providing a first mask which is a phase shifting mask having at least one phase shifting boundary formed by directly abutting 0° and 180° portions;
   conducting a first exposure by use of said first mask;
   providing a second mask; and
   conducting a second exposure with said second mask for compensating for an insufficient amount of light present as a result of said first exposure at said phase shifting boundary.

2. A method according to claim 1 wherein said sufficient light exposure occurs when said first mask is used at said phase shifting boundary and said second mask provides light exposure at said phase shifting boundary where said insufficient light was provided in the first exposure.

3. A method according to claim 1 wherein the second exposure occurs prior to development of the first exposure.

4. A method of forming a pattern, comprising the steps of:
   providing a first mask which is a phase shifting mask having a plurality of phase shifting boundaries defined by directly abutting 0° and 180° portions, the phase shifting first exposure mask having first and second adjacent patterns and a third pattern which is adjacent the first and second patterns, the first pattern being divided into a 180° portion and a 0° portion, the second pattern being divided into a 0° portion and a 180° portion, and the third pattern being divided into a 0° and a 180° portion, the third pattern 0° portion lying adjacent but spaced from the first pattern 180° portion and the 180° third pattern portion lying adjacent but spaced from the 0° second pattern portion;
   conducting a first exposure by use of said first mask;
   providing a second mask; and
   conducting a second exposure with said second mask for compensating for an insufficient amount of light present as a result of said first exposure by irradiating light at the phase shifting boundary between the 0° and 180° portions of each of said first, second, and third patterns.

5. An exposure method for forming a pattern where an inter-pattern distance on a substrate is less than $2.4 \times \lambda/na$ where $\lambda$ is a wavelength of exposure light and na represents an aperture number after exposure, comprising the steps of:
   providing at least first and second identical phase shifting masks each having an identical pattern thereon, the patterns having gaps therein;
   providing a first exposure by using the first mask; and
   conducting a second exposure by use of the second mask but with the second mask having a deviated position relative to the first mask such that portions of the pattern of the second mask are positioned in the gaps in the first pattern of the first mask used in the first exposure so that a composite exposed pattern results having said inter-pattern distance of less than $2.4 \times \lambda/na$.

* * * * *